(12) United States Patent
Aupke

(10) Patent No.: US 12,004,335 B2
(45) Date of Patent: Jun. 4, 2024

(54) DEVICE FOR ABSORBING ELECTRICAL NOISE ON LINES, AND METHOD FOR ARRANGING SUCH A DEVICE

(71) Applicant: WÜRTH ELEKTRONIK EISOS GMBH & CO. KG, Waldenburg (DE)

(72) Inventor: Klaus Aupke, Emsdetten (DE)

(73) Assignee: WÜRTH ELEKTRONIK EISOS GMBH & CO. KG, Waldenburg (DE)

( * ) Notice: Subject to any disclaimer, the term of this patent is extended or adjusted under 35 U.S.C. 154(b) by 0 days.

(21) Appl. No.: 17/767,801

(22) PCT Filed: Sep. 7, 2020

(86) PCT No.: PCT/EP2020/074895
§ 371 (c)(1),
(2) Date: Apr. 8, 2022

(87) PCT Pub. No.: WO2021/069159
PCT Pub. Date: Apr. 15, 2021

(65) Prior Publication Data
US 2024/0090187 A1  Mar. 14, 2024

(30) Foreign Application Priority Data

Oct. 11, 2019 (DE) .......................... 1020192156193

(51) Int. Cl.
*H05K 9/00* (2006.01)
*H01F 27/26* (2006.01)

(52) U.S. Cl.
CPC ......... *H05K 9/0007* (2013.01); *H01F 27/266* (2013.01); *H05K 9/0081* (2013.01)

(58) Field of Classification Search
CPC .............................. H05K 9/0066; H01F 27/266
See application file for complete search history.

(56) References Cited

U.S. PATENT DOCUMENTS 4,871,329 A * 10/1989 Van Der Meer ..... H05K 5/0013
439/594
5,736,672 A *  4/1998 Huang ................. H05K 9/0066
174/391

(Continued)

FOREIGN PATENT DOCUMENTS

CN         1816978 A     8/2006
EP         1689078 A1    8/2006

(Continued)

OTHER PUBLICATIONS

Russian Decision on Granting a Patent for Invention with English Translation, dated Jan. 11, 2023, 13 pages.

*Primary Examiner* — Hung V Ngo
(74) *Attorney, Agent, or Firm* — Boyle Frederickson S.C.

(57) ABSTRACT

The invention concerns a device for absorbing electrical noise on lines, with a housing having two housing parts, wherein each housing part is provided for receiving an element of a noise-absorbing material, wherein in the closed state, the housing has a passage opening in each of two opposing end walls for one or more lines, wherein the elements in the housing parts in the closed state of the housing form a passage for one or more lines, wherein the passage openings in the housing and the passage formed by means of the elements define a passage direction for the at least one line, and wherein a locking device is provided for locking the housing parts in the closed state of the housing, wherein the housing parts are configured such that by means of a relative movement of the housing parts with respect to each other, wherein a main component of the relative movement runs parallel to the passage direction, the housing parts can be moved into the closed state of the housing and locked together in the closed state.

15 Claims, 19 Drawing Sheets

(56) References Cited

U.S. PATENT DOCUMENTS

| | | | |
|---|---|---|---|
| 6,140,899 A | 10/2000 | Kayser et al. | |
| 2002/0125034 A1* | 9/2002 | Kuo | H05K 9/0066 174/92 |
| 2007/0120635 A1 | 5/2007 | Kobayashi et al. | |

FOREIGN PATENT DOCUMENTS

| | | |
|---|---|---|
| EP | 2630648 A1 | 8/2013 |
| EP | 2911311 A1 | 8/2015 |
| JP | 01041108 U | 3/1989 |
| JP | H0313713 U | 2/1991 |
| JP | H03171604 A | 7/1991 |
| JP | H07240318 A | 9/1995 |
| JP | 2523111 Y2 | 1/1997 |
| JP | H1174675 A | 3/1999 |
| RU | 83158 U1 | 5/2009 |
| RU | 2563580 C2 | 11/2014 |
| TW | 200808166 A | 2/2008 |
| TW | 201643899 A | 12/2016 |

* cited by examiner

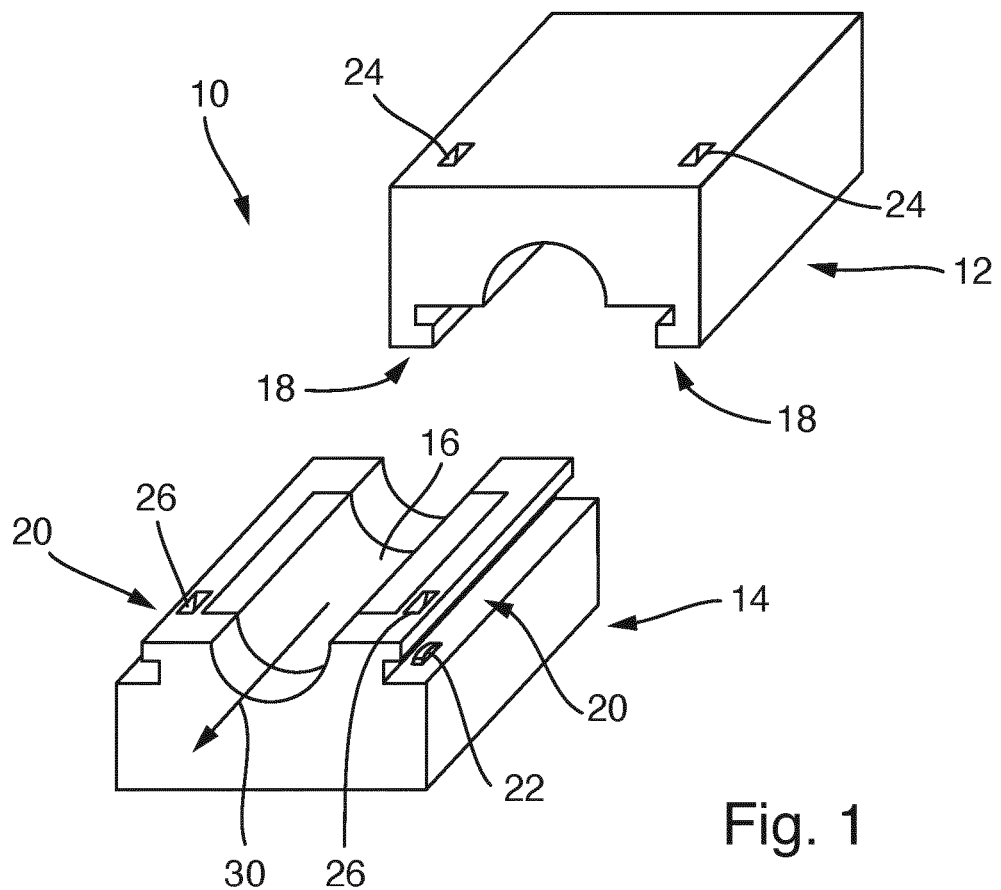
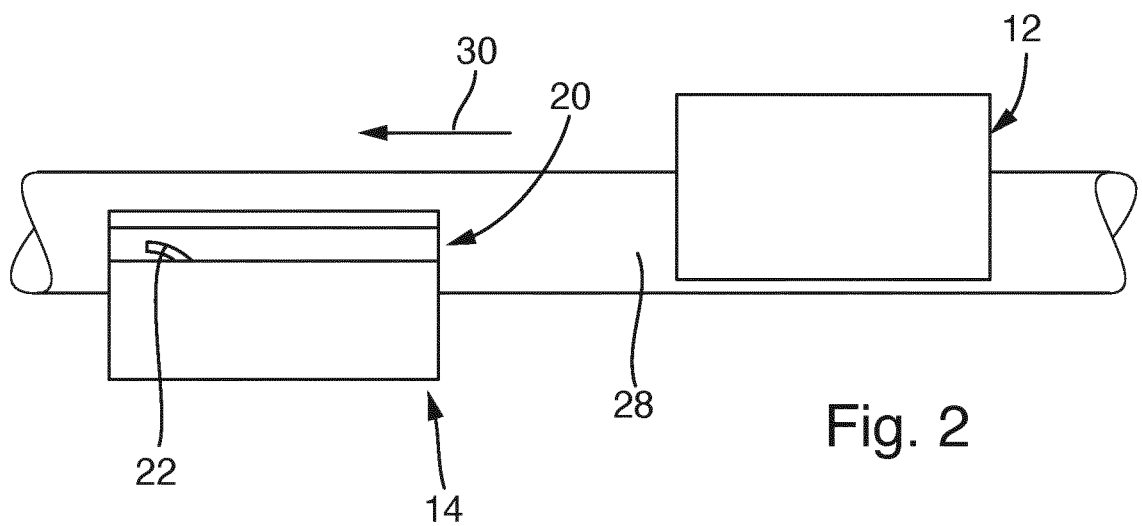

ND METHOD FOR
DEVICE FOR ABSORBING ELECTRICAL NOISE ON LINES, AND METHOD FOR ARRANGING SUCH A DEVICE

FIELD OF THE APPLICATION

The invention concerns a device for absorbing electrical noise on lines, with a housing having two housing parts, wherein each housing part is provided for receiving an element of a noise-absorbing material, wherein in the closed state, the housing has a passage opening in each of two opposing end walls for one or more lines, wherein the elements in the housing parts in the closed state of the housing form a passage for one or more lines, wherein the passage openings in the housing and the passage formed by means of the elements define a passage direction for the at least one line, and wherein a locking device is provided for locking the housing parts in the closed state of the housing. The invention also concerns a method for arranging a device according to the invention on at least one electrical line.

BACKGROUND

European patent publication EP 2630648 B1 discloses a device for absorbing electrical noise on lines, with a housing having two housing parts, wherein each housing part is provided to receive an element of a noise-absorbing material. The two housing parts may be connected together by means of a film hinge and be closed and locked together by means of a folding movement about the hinge. It is also described that the two housing parts are separate from each other and are moved towards each other and locked together by a linear movement perpendicular to an inserted electrical line.

European patent publication EP 2911311 B1 describes a further device for absorbing electrical noise on lines, with a housing having two housing parts, wherein each housing part is provided to receive an element of a noise-absorbing material. The two housing parts may be connected together by means of a linear guide, and the two housing parts can be moved into the closed state of the housing by means of a linear sliding movement. The linear movement takes place perpendicularly to an inserted electrical line.

SUMMARY

The invention aims to improve a device for absorbing electrical noise on lines and a method for arranging such a device with respect to the space required to arrange the device on an electrical line.

According to the invention, for this a device is provided for absorbing electrical noise on lines, with a housing having two housing parts, wherein each housing part is provided for receiving an element of a noise-absorbing material, wherein in closed state, the housing has a passage opening in each of two opposing end walls for one or more lines, wherein the elements in the housing parts in the closed state of the housing form a passage for one or more lines, wherein the passage openings in the housing and the passage formed by means of the elements define a passage direction for the at least one line, and wherein a locking device is provided for locking the housing parts in the closed state of the housing, wherein the housing parts are configured such that by means of a relative movement of the housing parts with respect to each other, wherein a main component of the relative movement runs parallel to the passage direction, the housing parts can be moved into the closed state of the housing and locked together in the closed state.

A relative movement of the housing parts with respect to each other takes place over at least one third of the distance covered by the relative movement parallel to the passage direction, i.e. parallel to the at least one line. For example, the relative movement may firstly provide an arcuate approach of the two housing parts until then a movement takes place parallel to the passage direction over at least one third of the distance of the relative movement, in order to bring the housing into the closed state and lock the two housing parts together. A movement of the two housing parts may for example firstly take place obliquely but linearly relative to the passage direction, and then parallel to the passage direction over at least one third of the distance of the relative movement. Because of the relative movement with a main component of the relative movement parallel to the passage direction, the device according to the invention is advantageous in particular in restricted spatial conditions, since no space is required for folding the two housing parts, or no space or only little space is required for a relative movement perpendicular to the passage direction.

Because the two housing parts are brought into the closed state of the housing and simultaneously locked together by means of a relative movement substantially parallel to the passage direction, less space is required for arranging the device for absorbing electrical noise on one or more lines than conventional devices. The relative movement has a main component parallel to the passage direction, i.e. running substantially parallel to the passage direction. Thus, perpendicularly to the line, only very little space is required; in the extreme case, only sufficient space for the two housing parts to be able to be arranged on the line and moved on the line parallel to the line. The device according to the invention offers advantages precisely when devices for absorbing electrical noise must be arranged inside housings of an electrical or electronic device. The device according to the invention may naturally also be mounted in more generous spatial conditions, for example on a supply line into a housing of an electronic or electrical device.

Because both the bringing together of the two housing parts and the locking of the two housing parts together in the closed state take place by means of one and the same relative movement, the device according to the invention can be arranged on one or more lines rapidly and without problems, and in some cases in automated fashion. The relative movement may be completely rectilinear or for example rectilinear over at least one third of the distance covered. The space-saving in comparison with conventional devices, when the device is arranged on one or more lines, is achieved in that a main component of the relative movement runs parallel to the passage direction. The relative movement thus runs substantially parallel to the passage direction, in particular at least over one third of the distance covered. The distance covered is measured from a first contact of the housing halves until the fully closed and locked state of the housing. The elements of noise-absorbing material are made for example from ferrite material, and the housing is made for example from plastic in plastic injection-moulding.

In a refinement of the invention, the two housing parts are formed identically.

By forming the housing parts so that the housing parts can be moved into the closed state of the housing and locked together in the closed state by means of a relative movement of the housing parts with respect to each other, wherein a main component of the relative movement runs parallel to the passage direction, the two housing parts may be formed identically. This considerably facilitates the production of the device according to the invention in large numbers, since only one mould or several identical mould nests is/are required for production of the housing of the device. For example, the housing of the device is produced by means of plastic injection-moulding. A plastic injection-moulding tool may comprise several identical mould nests each for one housing part.

In a refinement of the invention, the housing is divided parallel to the passage direction by means of the housing parts.

In this way, two comparatively flat housing parts may be produced.

In a refinement of the invention, the housing is divided obliquely to the passage direction by means of the housing parts.

In this way, because of the shaping of the housing parts, an end stop for the relative movement upon connection of the two housing parts can be created. The two housing parts are moved towards each other substantially parallel to the passage direction until faces of the two housing parts running obliquely to the passage direction bear against each other.

In a refinement of the invention, in the closed state of the housing, the elements are divided obliquely to the passage direction.

The elements of a noise-absorbing material, for example ferrite elements, may also be divided obliquely to the passage direction and hence provide contact faces arranged obliquely to the passage direction. Usually, the elements of a noise-absorbing material in the closed state of the housing of the device are arranged such that they lie tightly against each other. This state may then simultaneously define the closed state of the housing.

In a refinement of the invention, the housing parts are provided with a sliding guide.

In this way, the relative movement can be defined by means of the sliding guide, at least in portions, so that the correct positioning of the two housing parts with respect to each other and their correct locking in the closed state of the housing may be ensured.

In a refinement of the invention, the sliding guide is formed as a sliding block guide.

Sliding block guides may be configured in various ways and for example define insertion chamfers and latching means. In this way, both the function of guiding the two housing parts towards each other during the relative movement, and also the locking of the two housing parts together, can be achieved by means of the sliding block guide.

In a refinement of the invention, the sliding guide is configured as a linear guide by means of guide rails.

Guide rails allow a defined relative movement for moving the two housing parts into the closed state of the housing. Sliding guides may for example be designed process-reliably on plastic injection-mouldings, with the necessary tolerances to allow firstly ease of movement and secondly precise positioning of the housing halves with respect to each other.

In a refinement of the invention, the locking device has latching means with latching protrusions and latching recesses.

Latching protrusions and latching recesses allow the two housing parts to be securely locked together. Suitably, the latching protrusions and latching recesses are formed such that the correctly locked state of the latching protrusions and latching recesses can be identified from the outside of the device, in particular from an outside of the housing. This makes it easier for a user to identify correct locking, and in automated assembly may also serve for the correctly locked state to be identified by means of cameras and image processing or in another automated fashion.

In a refinement of the invention, the latching means are arranged separately from the sliding guide.

In this way, the design of the latching means is independent of the design of the sliding guides, so that both the sliding guide and the latching means can be optimised for their respective function.

In a refinement of the invention, the latching means have sprung latching arms.

By means of sprung latching arms, automatic locking can be reliably achieved at the end of the relative movement of the two housing halves with respect to each other. The latching arms may be configured as unilaterally attached arms or also as sprung brackets attached at both ends, in particular U-shaped brackets.

In a refinement of the invention, the latching means are arranged on the sliding guide.

In this way, the latching means may be arranged compactly.

In a refinement of the invention, the latching means have at least one latching recess in the sliding guide.

By means of a latching recess in the sliding guide, in which a latching protrusion on the associated part of the sliding guide on the other housing part may engage, a space-saving and also secure locking of the two housing parts together in the closed state of the housing may be ensured. Advantageously, the latching recess and the latching protrusion, when engaged, block a relative movement of the housing parts in and against the passage direction.

In a refinement of the invention, at least one of the elements for example ferrite elements is provided with at least one approach chamfer, in other words a lead-in slope, wherein the approach chamfer of one element runs on the respective other element during the relative movement from the open state to the closed state of the housing.

In order to guarantee good electrical and magnetic properties of the noise-absorbing elements, for example ferrite elements, in the closed state of the housing, both elements—which are for example usually configured as channels, in other words grooves, —are held tightly and substantially gap-free against each other in the closed state of the housing. Such an end position of the two elements relative to each other is ensured in reliable fashion if, during the relative movement of the two housing parts with respect to each other, the elements abut each other by means of the approach chamfers and are then pressed together during the relative movement. In this way, in closed state of the housing, the elements can bear against each other very tightly and substantially without gaps.

In a refinement of the invention, a spring device is provided between a respective element and the assigned housing part in order to preload the element in the direction of the element in the other housing part when the housing is closed.

By means of at least one spring device, the elements are pretensioned against each other and it can be ensured that the contact faces of the elements, for example ferrite elements each formed as a channel, bear against each other substantially without gaps in the closed state of the housing.

In a refinement of the invention, the spring device comprises a leaf spring.

Leaf springs can be designed extremely compactly but nonetheless can provide a comparatively high spring force. When the two elements are pressed together, only little spring travel is required, but a large spring force is advantageous for ensuring the substantially gap-free contact between the two elements. These requirements can be fulfilled by leaf springs. Suitable leaf springs are for example formed segment-like or also rectangular.

The object on which the invention is based is also achieved by a method for arranging a device according to the invention for absorbing electrical noise on at least one line, wherein the two housing parts of the housing of the device are moved into the closed state of the housing and locked together in the closed state by means of a relative movement of the two housing parts with respect to each other, wherein a main component of the relative movement runs parallel to the passage direction.

Further features and advantages of the invention arise from the claims and the description below of preferred embodiments of the invention in connection with the drawings. Individual features of the various embodiments may be combined with each other in arbitrary fashion without exceeding the scope of the invention. This also applies to the combination of individual features without further individual features, in connection with which they are shown or described.

BRIEF DESCRIPTION OF THE DRAWINGS

The drawings show:
FIG. 1 a depiction of a first embodiment of the invention in the open state of a housing,
FIG. 2 a side view of the device from FIG. 1,
FIG. 3 an oblique, top, front view of a further device according to the invention, in the closed state of the housing,
FIG. 4 an oblique, top, rear view of the device from FIG. 3,
FIG. 5 an oblique top view of the lower housing part of the device from FIG. 3,
FIG. 6 a front view of the housing part from FIG. 5,
FIG. 7 an oblique rear view of the housing part from FIG. 5, without the noise-absorbing element shown in FIG. 5,
FIG. 8 the two noise-absorbing elements of the device from FIG. 3 without the housing parts,
FIG. 9 an oblique front view of a device for absorbing electrical noise on lines according to a further embodiment of the invention,
FIG. 10 the lower housing part of the device from FIG. 9 with ferrite element inserted,
FIG. 11 the housing part from FIG. 10 without the ferrite element,
FIG. 12 the ferrite element of the housing part from FIG. 10,
FIG. 13 an oblique front view of a further device for absorbing electrical noise on lines, according to a further embodiment,
FIG. 14 the lower housing part of the device from FIG. 13 with ferrite element inserted,
FIG. 15 the housing part from FIG. 14 without the ferrite element,
FIG. 16 the device from FIG. 13 without the upper housing part,
FIG. 17 the device from FIG. 13 in a side view,
FIG. 18 the housing part from FIG. 15 in a top view,
FIG. 19 the lower ferrite element of the device from FIG. 12 with an assigned leaf spring in the relaxed state, and
FIG. 20 the ferrite element and leaf spring from FIG. 18 with the leaf spring in compressed state.

DETAILED DESCRIPTION

Figure 3:
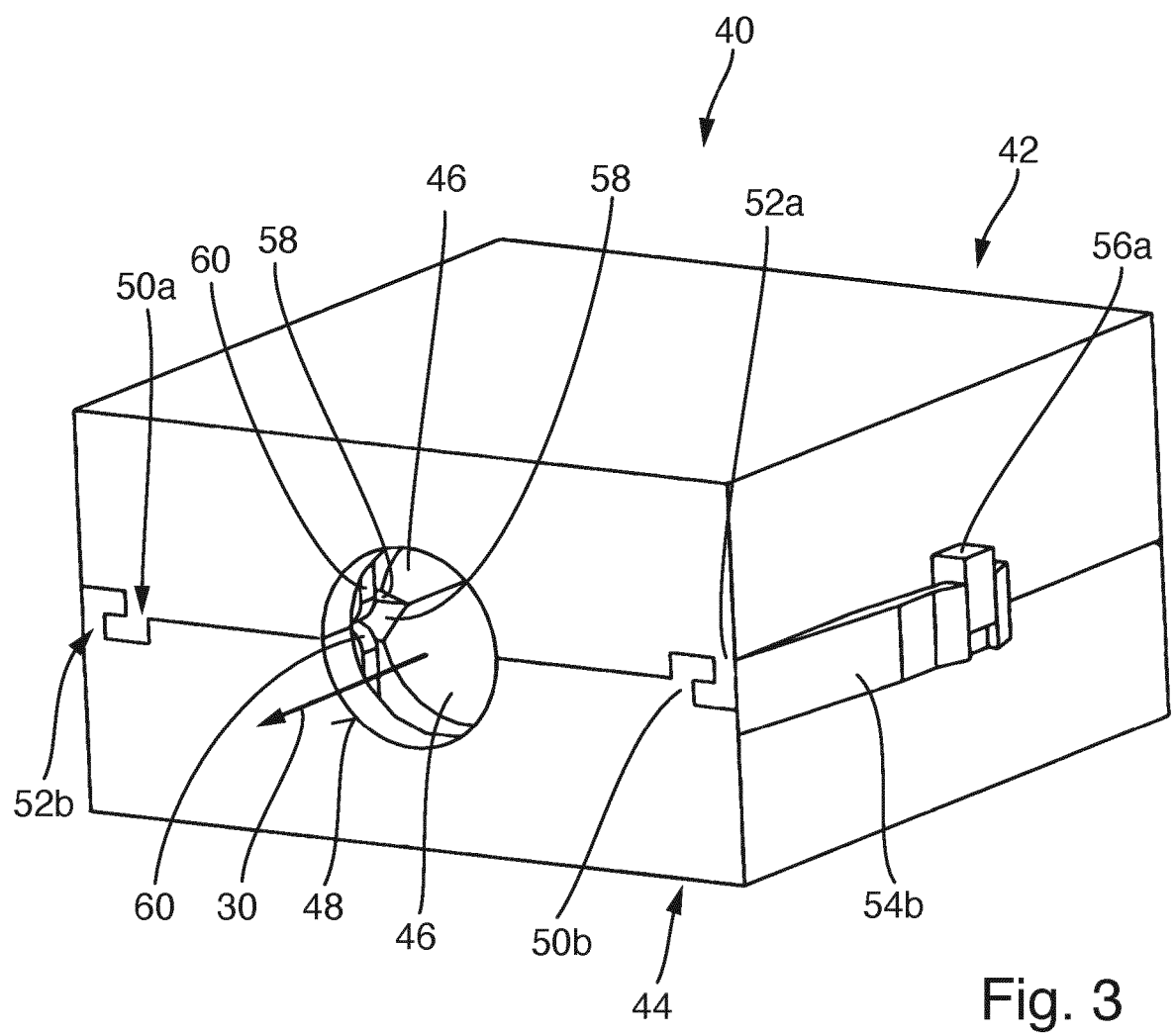

The depiction of FIG. 1 shows a device 10 according to the invention for absorbing electrical noise on lines. The device 10 has a first housing part 12 and a second housing part 14. An element of a noise-absorbing material, for example a ferrite element 16, is provided in each of the housing parts 12, 14, wherein the ferrite element in the upper housing part 12 cannot be seen in FIG. 1. The ferrite element 16 is formed as a channel. In a closed state of the housing, i.e. when the upper housing part 12 in FIG. 1 is placed on the lower housing part 14 in FIG. 1, the two ferrite elements 16 form a passage, closed in the radial direction, for one or more lines (not shown).

In the closed state of the housing, the two housing parts 12, 14 also form a respective passage opening for one or more lines (not shown) at their opposing end walls, in FIG. 1 at the front facing the viewer and at the rear facing away from the viewer.

In order to bring the housing of the device 10 into the closed state from the open state shown in FIG. 1, the first housing part 12 is placed on the rear end wall of the second housing part 14 such that guide strips 18 on the first housing part 12 engage in guide strips on the second housing part 14. The first housing part 12 can then only move relative to the second housing part 14 parallel to a passage direction 30, which runs parallel to the guide strips 18, 20 and also parallel to a line 28, which is not shown in FIG. 1 but is depicted in FIG. 2 and which is laid in the lower ferrite element 16. The first housing part 12 is moved parallel to the passage direction 30 until the front end wall of the first housing part 12 in FIG. 1 aligns with the front end wall of the second housing part 14 in FIG. 1. Thus the closed state of the housing is created, wherein the two ferrite elements 16 form a passage for the line which is substantially closed in the radial direction and open in the axial direction. The two housing parts 12, 14 are then securely fixed to each other also in directions perpendicular to the passage direction. Movement of the two housing parts 12, 14 relative to each other would be possible only in and against the passage direction 30. In the closed state of the housing however, sprung latching arms 22 on the guide strips 20—only one of which can be seen in FIG. 1—engage in corresponding recesses (not shown) on the guide strips 18 of the first housing part 12. This largely prevents a movement of the two housing parts 12, 14 both in and against the passage direction 30 when the housing is in the closed state.

In order to be able to separate the two housing parts 12, 14 from each other again, key openings 24 are provided in the first housing part 12 so as to be aligned with the recesses in the guide strips 18, and key openings 26 are provided in the guide strips 20 of the lower housing part 14. In the closed state of the housing, the key openings 24, 26 align with each other and—as stated
    the key openings 24, 26 also align with the latching recesses in the guide strips 18. Thus a corresponding key with two strip-like protrusions arranged parallel to each other may be arranged in the key openings 24, 26. If this key is pressed in the direction of the second housing part 14, the front edges of the strip-like protrusions press the sprung latching arms 22 out of the recesses in the guide strips 18, and the two housing parts 12, 14 can then again be moved relative to each other in and against the passage direction 30.

One of the sprung latching arms 22 can be seen in the side view of the second housing part 14 in FIG. 2. Also, several sprung latching arms may be provided in the sliding guide defined by the guide strips 18, 20, wherein the design of these arms may also differ from that shown in FIG. 2. For example, the latching arm 22 may be configured so as to block a sliding movement in two opposite directions, i.e. to the left and right in FIG. 2. For example, the sprung latching arm 22 may be configured as a sprung bow which extends into the sliding guide. In this case, for example, a corresponding depression could be made on the guide strips 18 of the first housing part, wherein said depression—as explained—could also be formed by the continuation of the key openings 24, 26.

In the context of the invention, it is essential that the two housing parts 12, 14 can be brought from the open state shown in FIG. 1 into the closed state of the housing by means of a relative movement with respect to each other which runs parallel to the passage direction of the line through the housing, and that this relative movement also at the same time causes a locking of the two housing parts 12, 14 together in the closed state of the housing. It is evident from FIG. 1 and also FIG. 2 that, to move the two housing parts 12, 14 into the closed state of the housing perpendicularly to the passage direction 30, only enough space is required for arranging the two housing parts 12, 14 on the line 28. However, no additional space above and below the first housing part 12 and the second housing part 14 is required. The device according to the invention is thereby particularly suitable for constricted spatial conditions, for example inside a casing of an electrical or electronic device.

Starting from the open state of the housing in FIG. 1 and FIG. 2, the two housing parts 12, 14—see FIG. 2—need only be moved relative to each other parallel to the passage direction 30, which runs parallel to the line 28, in order to be brought into the closed state of the housing and at the same time be locked together by means of the sprung latching arms 22.

The passage direction 30 is defined by means of the channel-like recesses in the ferrite elements 16 and the respective, approximately semicircular passage openings in the end walls of the two housing parts 12, 14. In the closed state of the housing, the passage direction 30 is thus defined by the closed cylindrical passage then formed by the ferrite element 16 and the then circular passage openings in the end faces of the housing. One or more lines are guided through the housing of the device 10 parallel to the passage direction 30.

Figure 4:
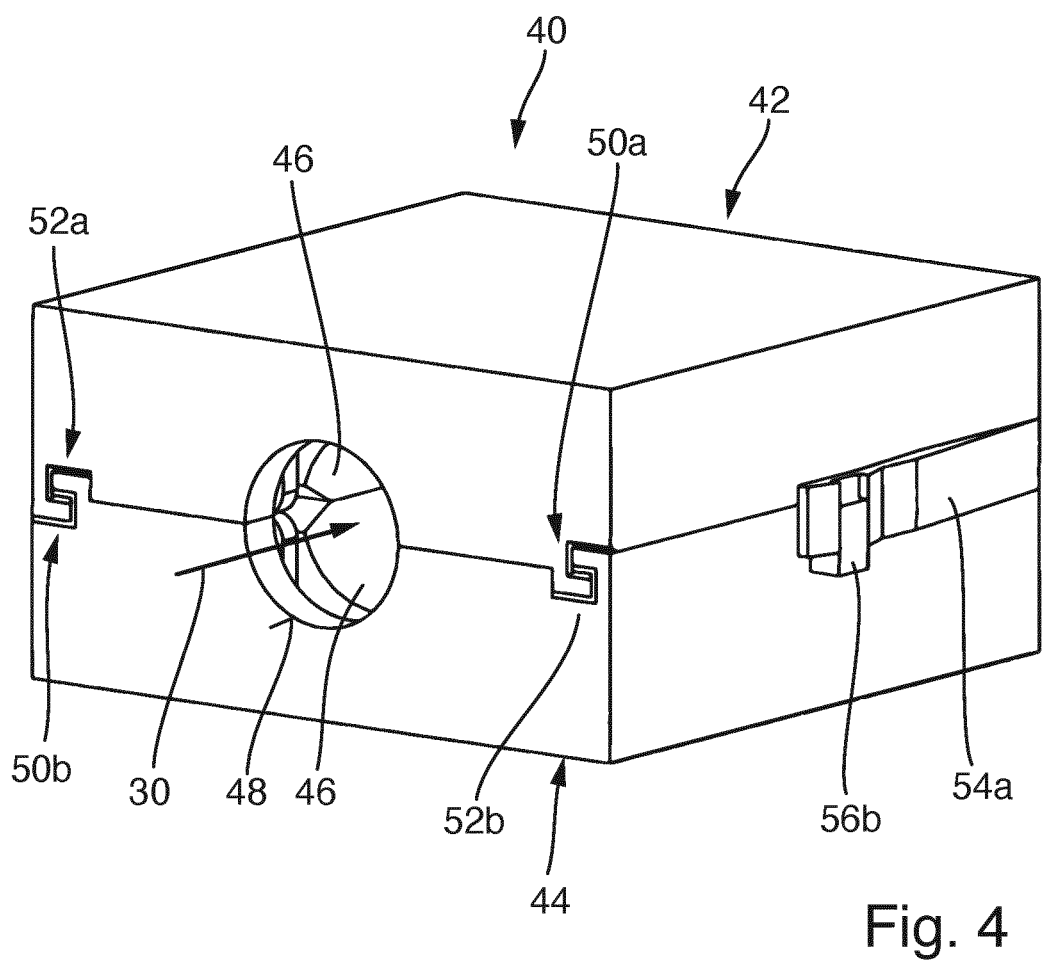

The depictions in FIG. 3 and FIG. 4 show a further device 40 according to the invention. FIG. 3 shows an oblique top view from the front of the device 40, and FIG. 4 an oblique top view from the rear. The device 40 has a first housing part 42 and a second housing part 44, wherein the two housing parts 42, 44 are configured identically. A channel-like ferrite element 46 is provided in each of the two housing parts 42, 44, wherein in the closed state of the housing (shown in FIG. 3 and FIG. 4), the ferrite elements 46 form a cylindrical passage for one or more lines which is closed in the radial direction. The end faces of the housing of the device 40, which in FIG. 3 and FIG. 4 lie at the front and rear, each have a passage opening 48 for one or more lines. The first housing part 42 and the second housing part 44 are each provided with guide strips 50a, 50b, 52a, 52b which together form a sliding guide. The guide strips 50a on the first housing part 42 engage in the guide strips 52b of the second housing part 44, see the left side of the device 40 in FIG. 3. The guide strips 52a of the first housing part 42 engage in the guide strips 50b of the second housing part 44, see the right side of the device 40 in FIG. 3. In this way, the two housing halves 42, 44 may be configured identically to each other and form a sliding guide by means of the guide strips 50a, 50b, 52a, 52b.

A sprung latching arm 54b can be seen on the right side of the device 40 in FIG. 3. The sprung latching arm 54b is formed integrally with the second housing part 44, and in the depicted closed state of the housing, engages in a latching recess 56a which is formed by means of a bracket on the first housing part 42. On the left side of the first housing part 42 (not visible in FIG. 3), the latter is provided with a further sprung latching spring arm 54a, and the second housing part 44 (on the left side, not shown in FIG. 3) is provided with a bracket which then forms the latching recess 56b, see also FIG. 4. The bracket may be L-shaped or also U-shaped.

If the two housing parts 42, 44 are placed on each other, starting from an open state of the housing, such that the guide strips 50, 52 engage in each other, and the two housing parts 42, 44 are then moved in the passage direction 30, the latching arms 54 are first deflected and then, when the two housing parts 42, 44 have reached the closed position of the housing shown in FIG. 3, snap into the latching recesses 56 formed by means of the brackets. FIG. 4 shows insertion chamfers or insertion bevels at the start of the guide strips 50a, 50b, 52a, 52b, which facilitate the mutual contact and insertion of the guide strips 50a, 50b, 52a, 52b.

Figure 5:
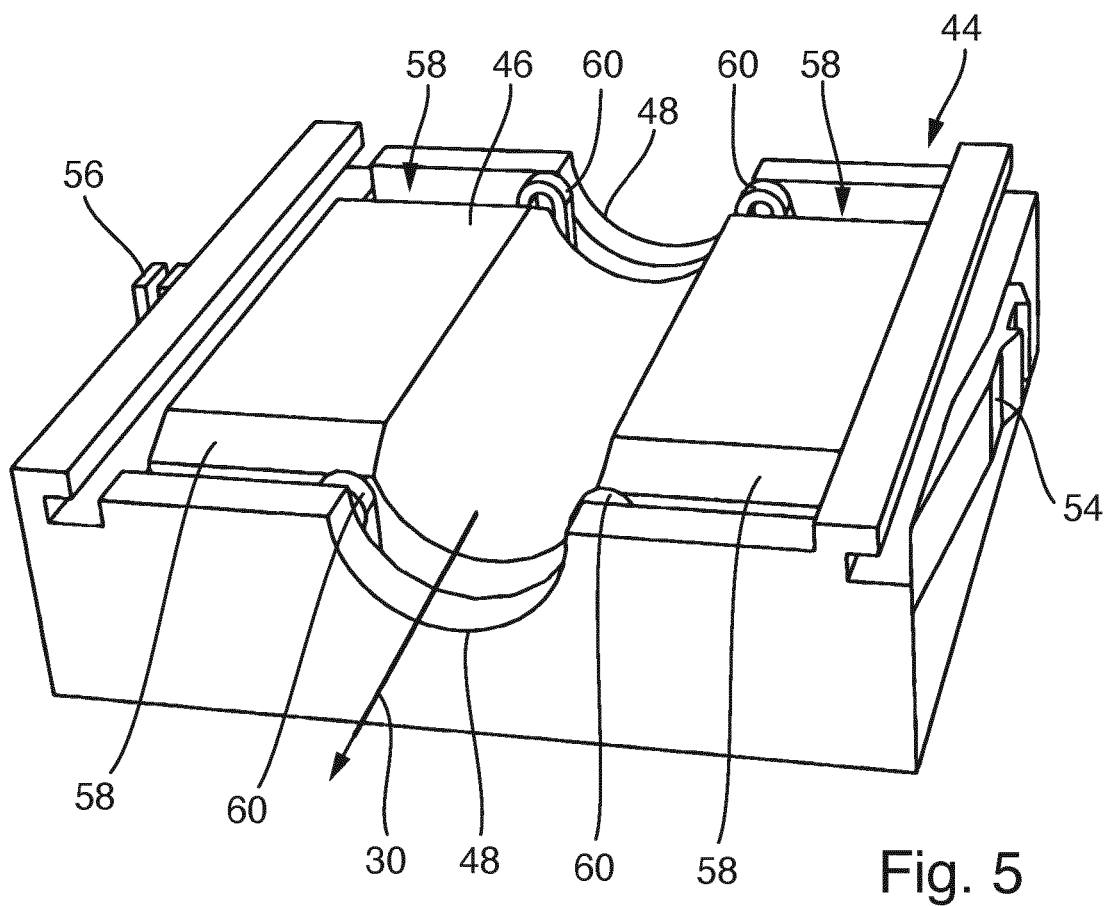

FIG. 5 shows the second housing part 44 from FIG. 3 and FIG. 4, in an oblique top above. The ferrite element 46 arranged in the trough-like second housing part 44 can be seen. The ferrite element 46 is generally formed as a channel and has a cylindrical recess with approximately semicircular cross-section for receiving one or more electrical lines, see the line 28 in FIG. 2. At the side of the recesses, the ferrite element 46 has approach chamfers 58 on its front edge (visible in FIG. 4). Identical approach chamfers 58 are also arranged on the back of the ferrite element 46, facing away from the viewer in FIG. 4. The ferrite element 46 in the first housing part 42 (see FIG. 3) is formed identically. When the two housing parts 42, 44 are moved against each other parallel to the passage direction 30, the front approach chamfers 58 of the ferrite element 46 in the first housing part 42 come into contact with the approach chamfers 58 (at the rear in FIG. 3) of the ferrite element 46 of the second housing part 44. The approach chamfers 58 may slide past each other, wherein the ferrite elements 46 are pressed in the direction of the floor of the respective housing part 42, 44. This is achieved by spring elements arranged between the floor of the respective housing part 42, 44 and the ferrite elements 46. In the closed state of the housing (see FIG. 3 and FIG. 4), the two ferrite elements 46 then lie substantially gap-free on each other and form a passage which is closed in the radial direction for a line 28, see FIG. 2.

FIG. 5 shows the U-shaped brackets 60 at the sides of the passage openings 48 on the second housing part 44. A U-shaped bracket 60 is arranged on both the left and the right of the semicircular passage opening 48. The U-shaped brackets 60 are fixedly and integrally connected by their open side (not visible in FIG. 5) to the floor of the second housing part 44. Above the floor, the legs of the bracket 60 (connected via a bottom portion) are however free so that the bracket 60 can deflect sideways under pressure. A line inserted in the ferrite element 46 may therefore, with corresponding thickness, be clamped by means of the U-shaped bracket 60. In the closed state of the housing, (see FIG. 3), four U-shaped brackets 60 are thus arranged on each passage opening 48; these then clamp the line and hence hold the device 40 in the established position on the line.

In FIG. 5, the bracket which forms the latching recess 56 can be seen on the left side of the second housing part 44. On the right side of the second housing part 44 in FIG. 5, the design of the latching arm 54 can be seen; when the two housing parts 42, 44 are pushed together, said latching arm engages in the latching recess 56 of the first housing part 42 and thereby latches the two housing parts 42, 44 together in the closed state of the housing.

Figure 6:
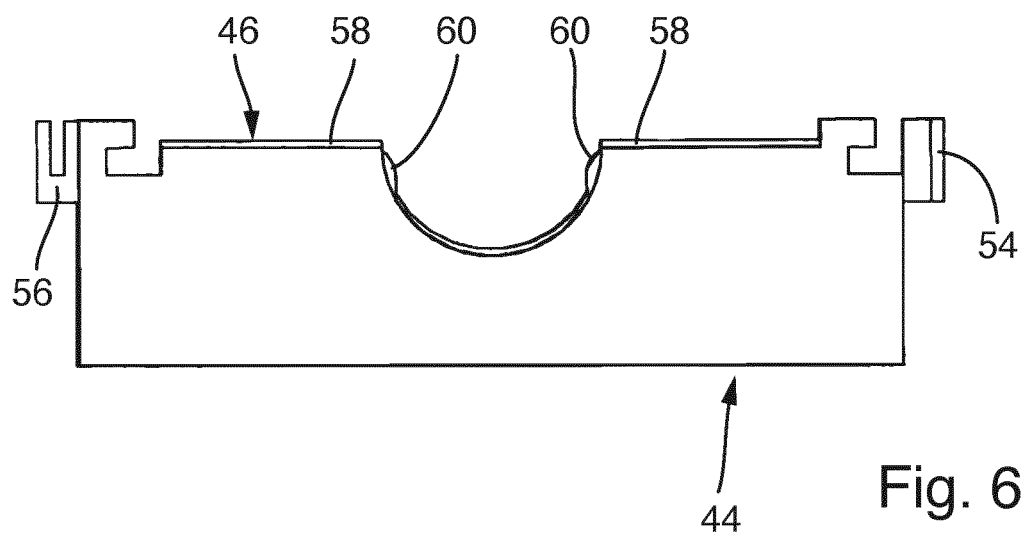

The depiction in FIG. 6 shows the second housing part 44 from FIG. 5 in a front view. It is clear from this front view that a top side of the ferrite element 46 protrudes slightly above the upper limit of the first housing part 44. FIG. 6 thus shows a portion of the front approach chamfers 58 of the ferrite element from FIG. 5. This position of the ferrite element 46 is achieved in the open state of the housing by means of a spring device (not shown in FIG. 6) arranged between the floor of the housing part 44 and the ferrite element 46. When the two housing parts 42, 44 are pushed together, the ferrite elements 46 are then pressed under the effect of the approach chamfers 58 in the direction of the floor of the respective housing part 42, 44, and then bear substantially gap-free against each other when the housing is in the closed state, see FIG. 3 and FIG. 4.

Figure 7:
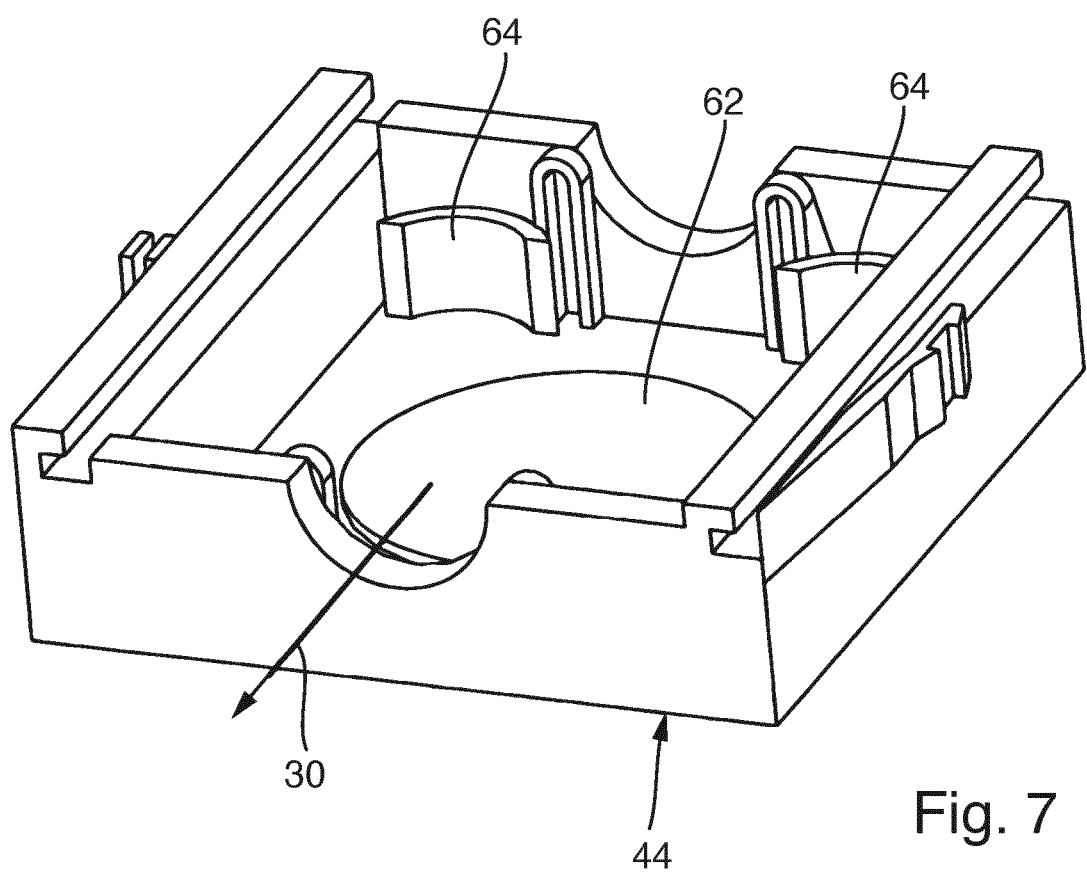

The depiction in FIG. 7 shows the second housing part 44 from FIG. 4 without the ferrite element 46. A spring device 62, for example in the form of a curved washer, can be seen on the floor of the second housing part 44. This spring device 62 ensures that the ferrite element 46 is pressed away from the floor of the second housing part 44 and assumes the position shown in FIG. 6. As already explained, the housing part 42 is formed identically to the second housing part 44 and also has a spring device 62.

In order to hold the ferrite element 46 in a defined position inside the second housing part 44, a total of four spring brackets 64 are provided in the housing part 44, only two of which can be seen in FIG. 7. The spring brackets 64 hold the ferrite element 46 firmly against slipping in and against the passage direction 30. In the context of the invention, instead of two mutually opposing spring brackets 64, other spring devices or clamping devices could be provided for holding the ferrite element securely in the correct position in the second housing part 44. As already explained, the first housing part 42 is formed identically to the second housing part 44, so that all explanations and clarifications with respect thereto also apply to the first housing part 42.

Figure 8:
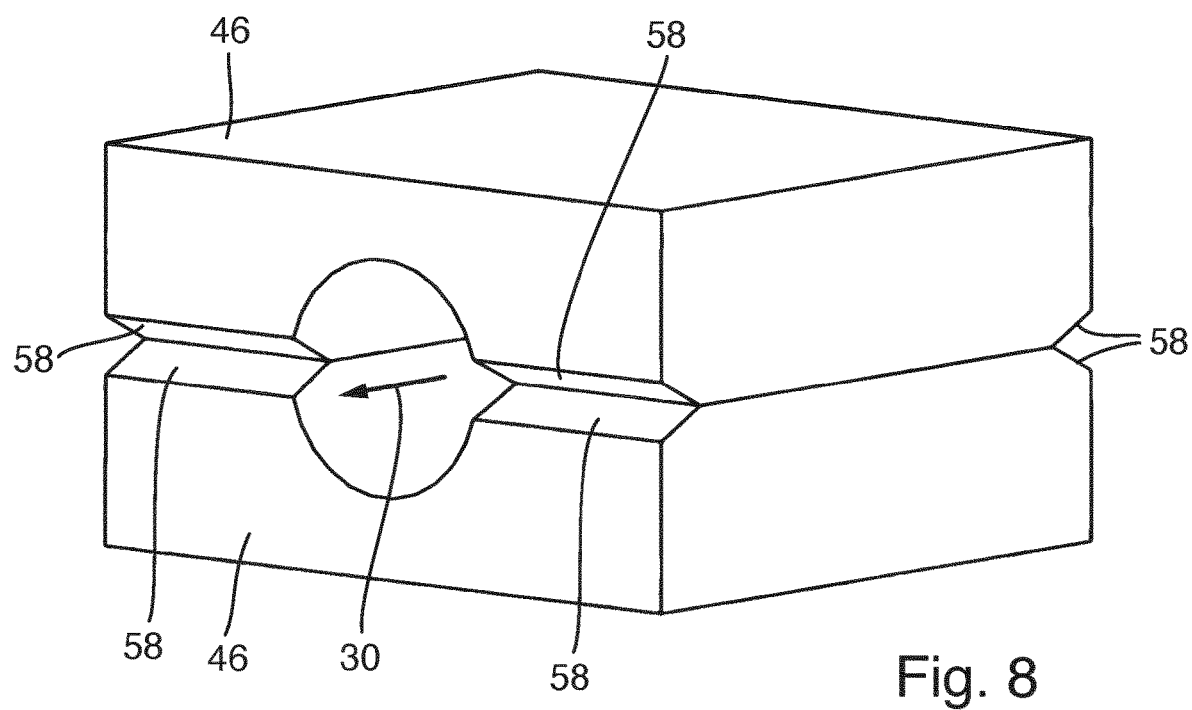

The depiction in FIG. 8 shows the two ferrite elements 46 without the housing. It is clearly evident that the respective contact faces of the two ferrite elements 46 lie gap-free against each other at the side of the passage for the line, and form the passage closed in the radial direction for one or more lines. The approach chamfers 58 of the two ferrite elements 46 are separated from each other again in the closed state of the housing, wherein their function when the two housing parts 42, 44 are brought together has already been explained.

A separating plane of the housing of the device 40, between the two housing parts 42, 44 and between the two ferrite elements 46, runs parallel to the passage direction 30.

Figure 9:
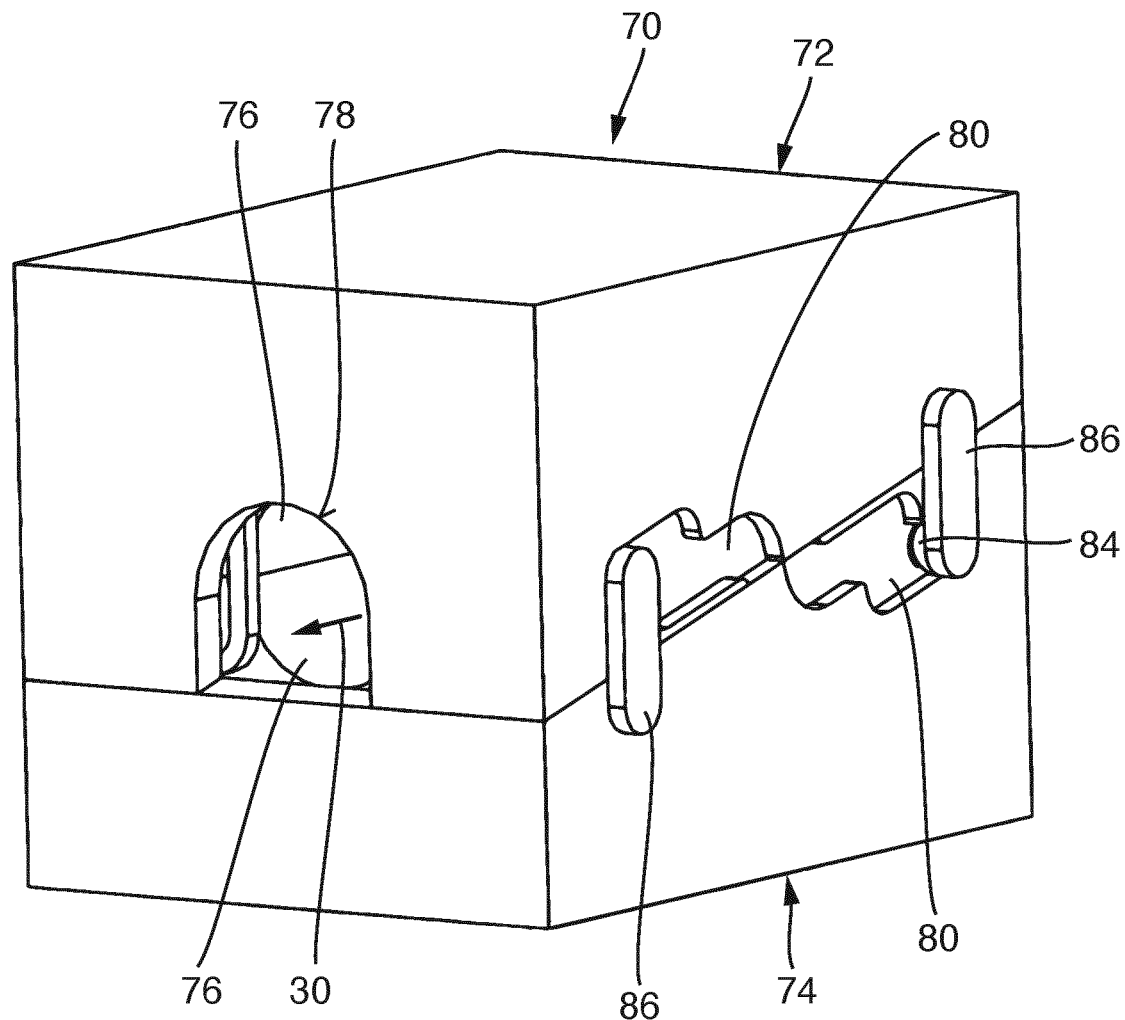

The depiction of FIG. 9 shows a further device 70 according to the invention. The device 70 has a housing with two housing parts 72, 74 formed identically to each other. A ferrite element 76 is arranged in each of the housing parts 72, 74. In the closed state of the housing shown in FIG. 9, the two ferrite elements 76 form a passage closed in the radial direction for one or more lines. The first housing part 72 is provided with a U-shaped recess in its end face (lying at the front left in FIG. 9), which together with the top of the end wall of the second housing part 74 forms a passage opening 78 for one or more lines. The rear side of the device 70 (facing away from the viewer in FIG. 9) is also provided with a passage opening 78.

The two housing parts 72, 74 are each provided with a sliding block guide 80 on the end faces (visible in FIG. 9), in which a sliding block 84 of the respective other housing part 72, 74 engages, wherein the sliding block 84 in turn is arranged on an arm 86 connected to the side wall of one of the housing parts 72, 74. The side faces of the housing parts 72, 74 which are not visible in FIG. 9 are formed identically to the side faces shown in FIG. 9.

In the depiction of FIG. 9, the sliding block 84 of the first housing part 72, which is integrally connected to the first housing part 72 by means of the arm 86, engages in the sliding block guide 80 of the second housing part 74. Similarly, a sliding block (not shown in FIG. 8) on a spring arm 86, which is connected to the second housing part 74, engages in the sliding block guide 80 of the first housing part 72.

Figure 10:
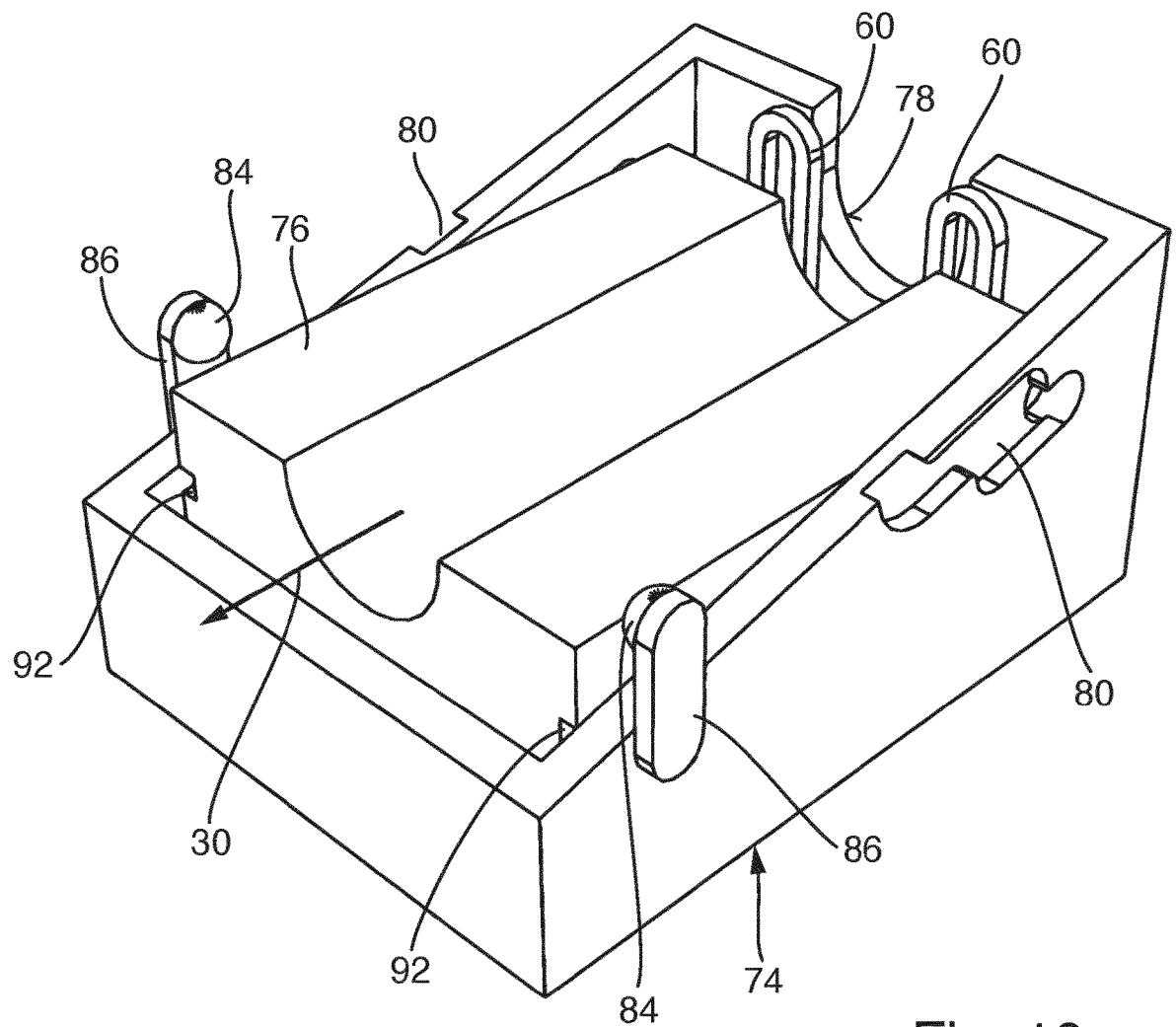

FIG. 10 shows only the second housing part 74 of the device 70 from FIG. 9. The ferrite element 76 is inserted in the second housing part 74. In FIG. 10, it is evident that a top side of the housing part 74 runs obliquely to the passage direction 30, while the top side of the ferrite element 76 runs parallel to the passage direction 30. The two housing parts 72, 74 are moved into the closed state of the housing by means of a relative movement which runs substantially parallel to the passage direction 30. The top side of each housing part 72, 74, arranged obliquely to the passage direction 30, then provides a defined end stop when the closed state of the housing is achieved. During this relative movement, the respective contact faces of the ferrite elements 76 slide along each other at the side of the channel for the line.

It is evident in FIG. 10 that the housing part 74 has two U-shaped brackets 60 adjacent to the assigned portion of the passage opening 78, which exert a clamping effect on an inserted line. The two identically formed sliding block guides 80 are provided in portions of the side walls of the second housing part 74 which are at the rear in FIG. 10, wherein only the start of the sliding block guide 80 arranged at the left in FIG. 10 can be seen. Opposite this, in the region of the second housing part 74 at the front in FIG. 10, the sliding blocks 84 are arranged, which are each connected to the respective side wall of the second housing part 74 by spring arms 86. The spring arms 86 are for example formed integrally with the second housing part 74 by means of injection moulding, and may thereby only have limited springing. The spring effect of the spring arms 86 is based on the elasticity of the material from which the spring arms 86 and also the other housing part 75 are produced, for example plastic. In the context of the invention, the spring arms 86 could also be formed so as to be rigid.

Figure 11:
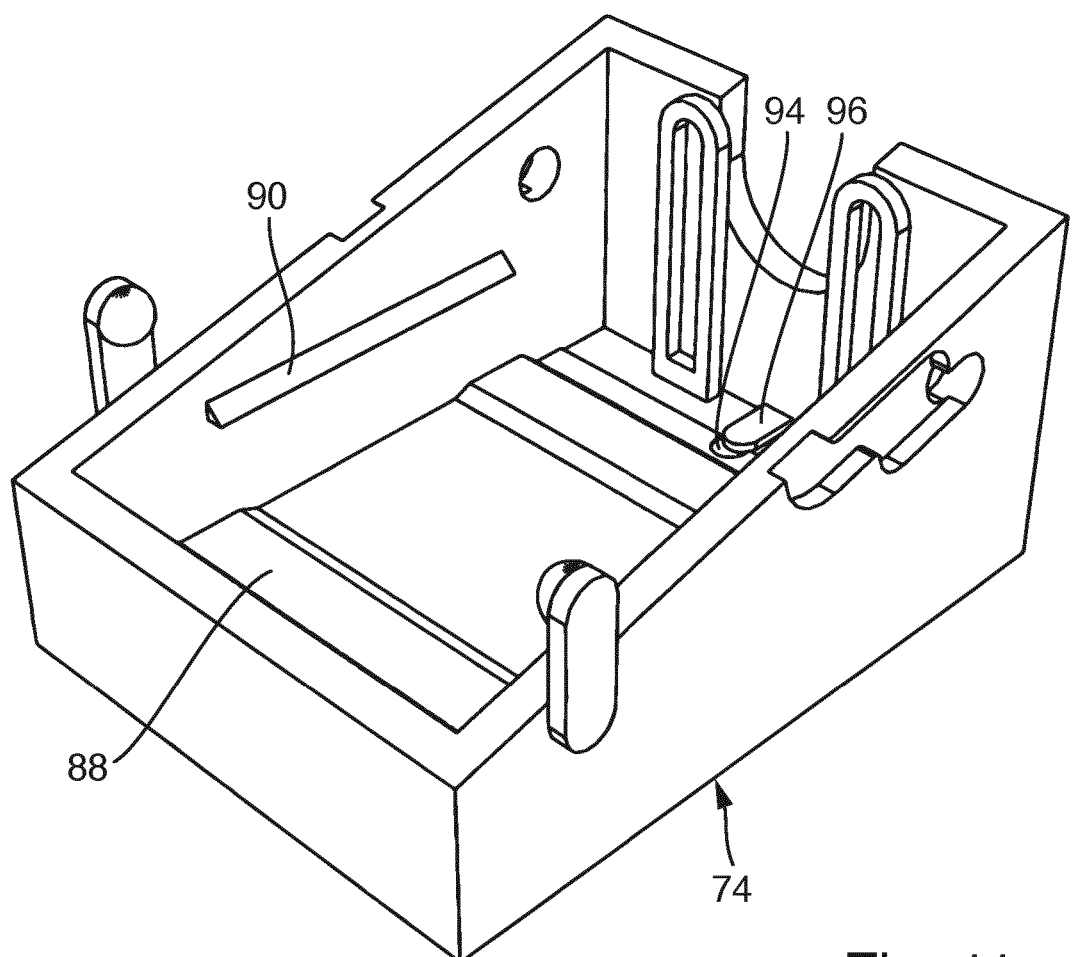

FIG. 11 shows the second housing part 74 from FIG. 10 without the ferrite element 76. In this way, a leaf spring 88 on the floor of the second housing part 74 can be seen, which—as already explained—presses the ferrite element 76 away from the second housing part 74 in the direction of the opposite ferrite element in the first housing part 72.

To prevent the ferrite element 76 from being pressed too far away from the second housing part 74 under the effect of the leaf spring 88, and also to prevent the ferrite element 76 from falling out of the second housing part 74 when the second housing part 74 is overturned, the insides of the side walls of the second housing part 74 are provided with latching strips 90 which form retaining protrusions and which can engage—at least in portions—in lateral longitudinal grooves 92 of the ferrite element 76, see FIG. 10. The latching strips 90 thus prevent the ferrite element 76 from being pressed away from the floor of the second housing part 74 beyond a defined position. The leaf spring 88 holds the ferrite element 76 in this defined position, in that it presses the ferrite element 76 against the underside of the latching strips 90.

On each of its end faces, the leaf spring 88 has a recess 94 which engages on a corresponding protrusion 96 on the floor of the second housing part 74. In the relaxed state of the leaf spring 88 (shown in FIG. 11), the protrusion 96 only engages in portions in the recess 94 on the leaf spring 88. In the closed state of the housing, the leaf spring 88 is then compressed and the protrusion 96 protrudes slightly further into the recess 94. By means of the protrusions 96 on the housing and the recesses 94 on the leaf spring 88, a precisely defined mounting position of the leaf spring 88 can be achieved. The protrusions 96 and the recesses 94 may for example also be configured such that the leaf spring engages in the protrusions 96 and is thereby held captively in the second housing part 74 during mounting of the device 70. As stated, the two housing parts 72, 74 are formed identically to each other, so that the statements made concerning the second housing part 74 also apply to the first housing part 72.

Figure 12:
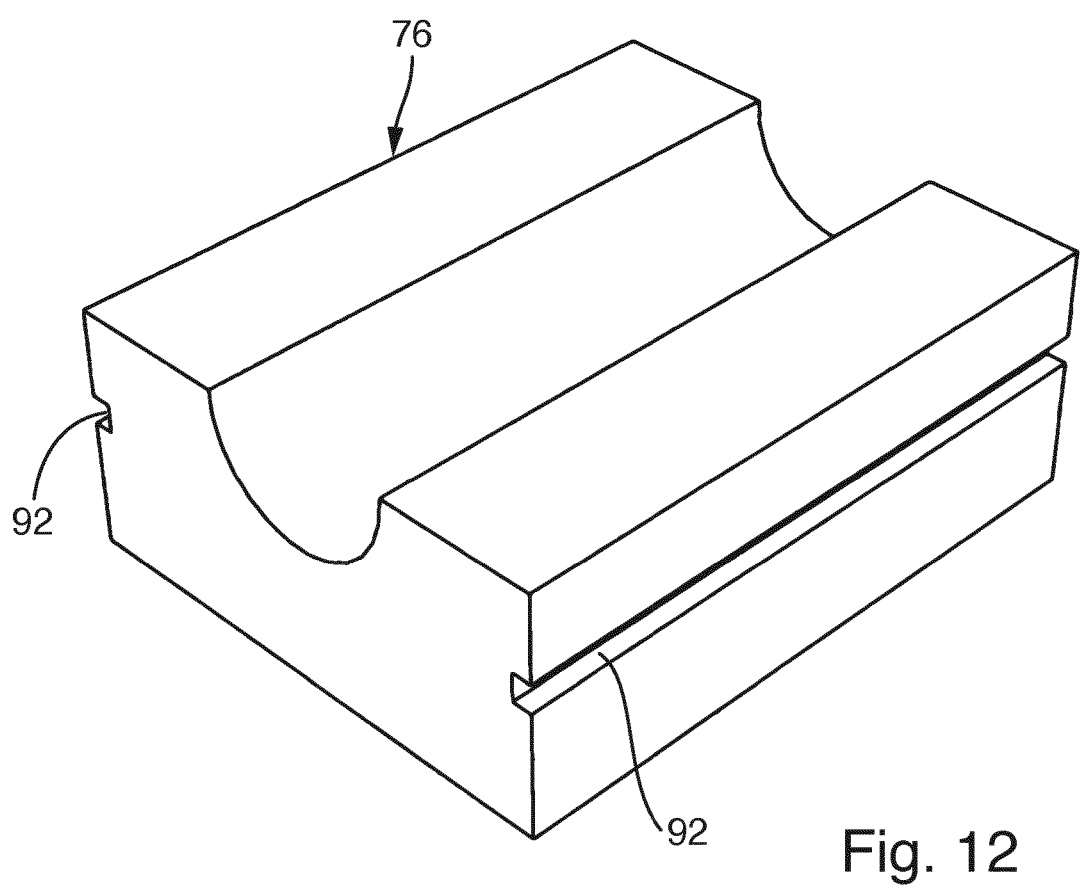

FIG. 12 shows the ferrite element 76 in an oblique front view. This view clearly shows the groove-like recesses 92 in opposing side walls of the ferrite element 76, in which—as explained—the latching strips 90 of the second housing part 74 engage, in order to hold the ferrite element 76 securely in the second housing part 74 but nonetheless allow a spring movement against the effect of the leaf spring 88 when the first housing part 72 is moved relative to the second housing part 74 in order to achieve the closed state of the housing.

Figure 13:
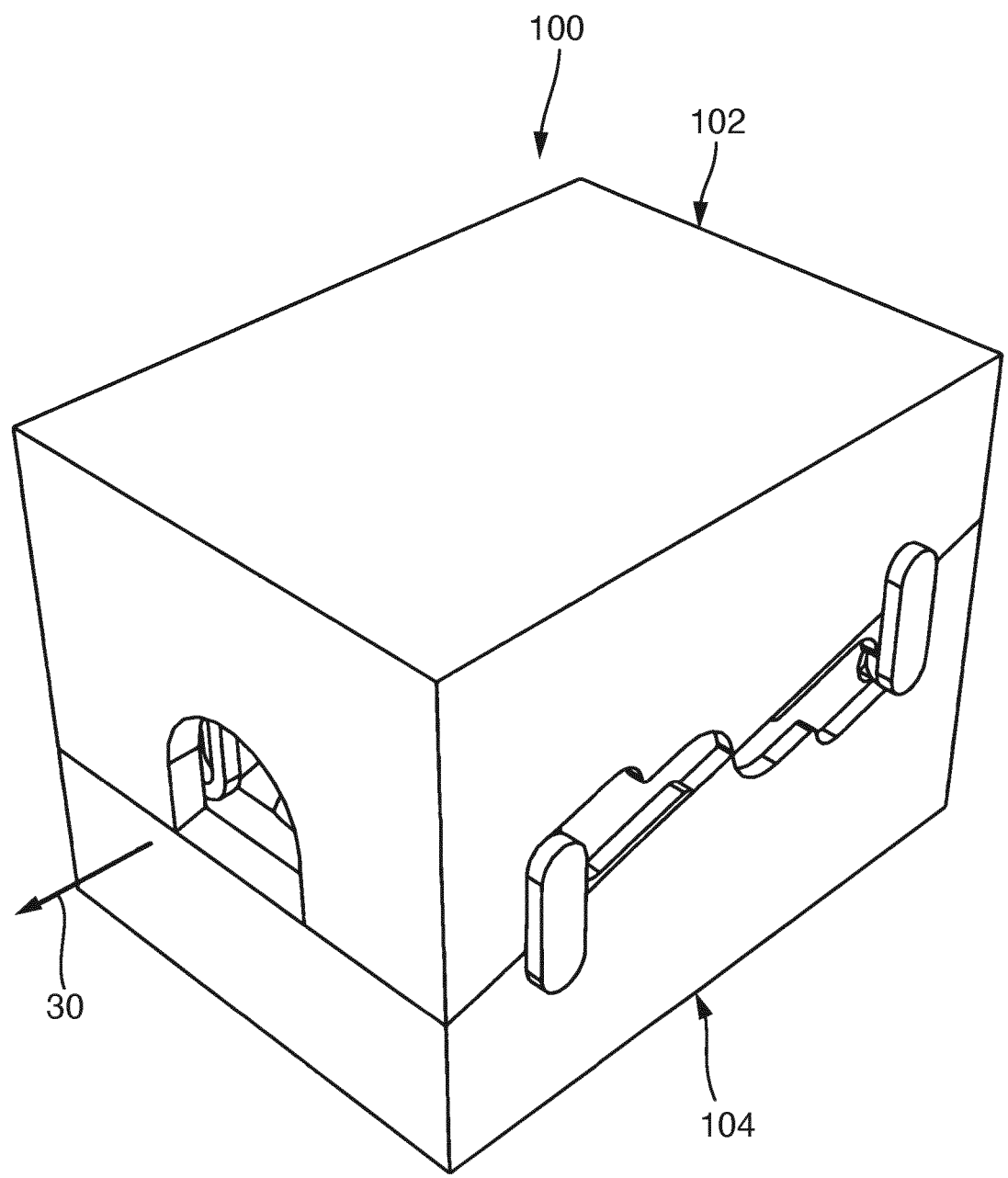

The depiction in FIG. 13 shows a further device 100 according to the invention, wherein the device 100 is constructed very similarly to the device 70 in FIGS. 9 to 12, and only the differences from the device 70 will be explained below.

Figure 15:
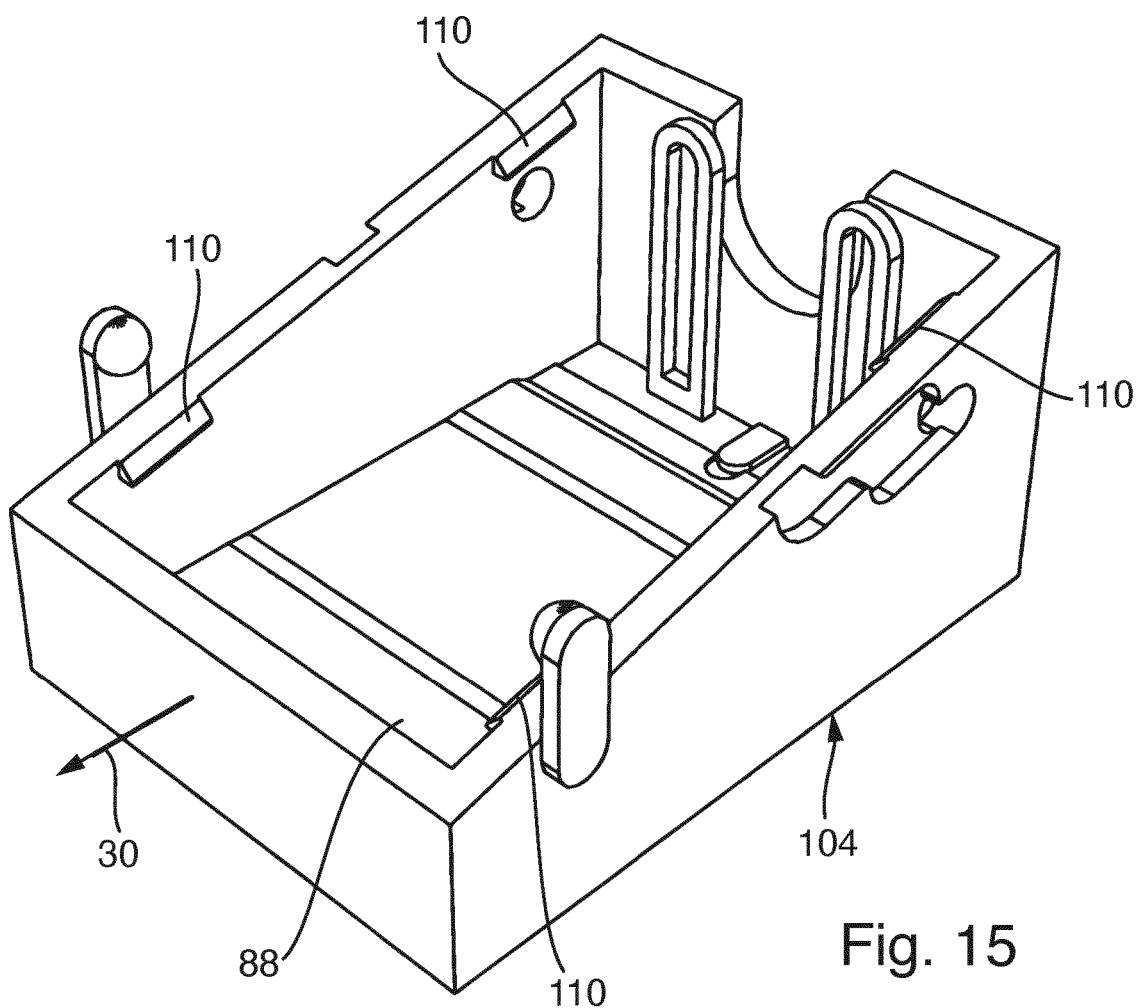

The device 100 has a housing with a first housing part 102 and a second housing part 104. The housing parts 102, 104 differ from the housing parts 72, 74 of the device 70 only in that latching strips 110 (evident in FIG. 15) are arranged not parallel to the passage direction 30 but obliquely to the passage direction 30. Otherwise, the housing parts 102, 104 are formed identically to the housing parts 72, 74.

Figure 14:
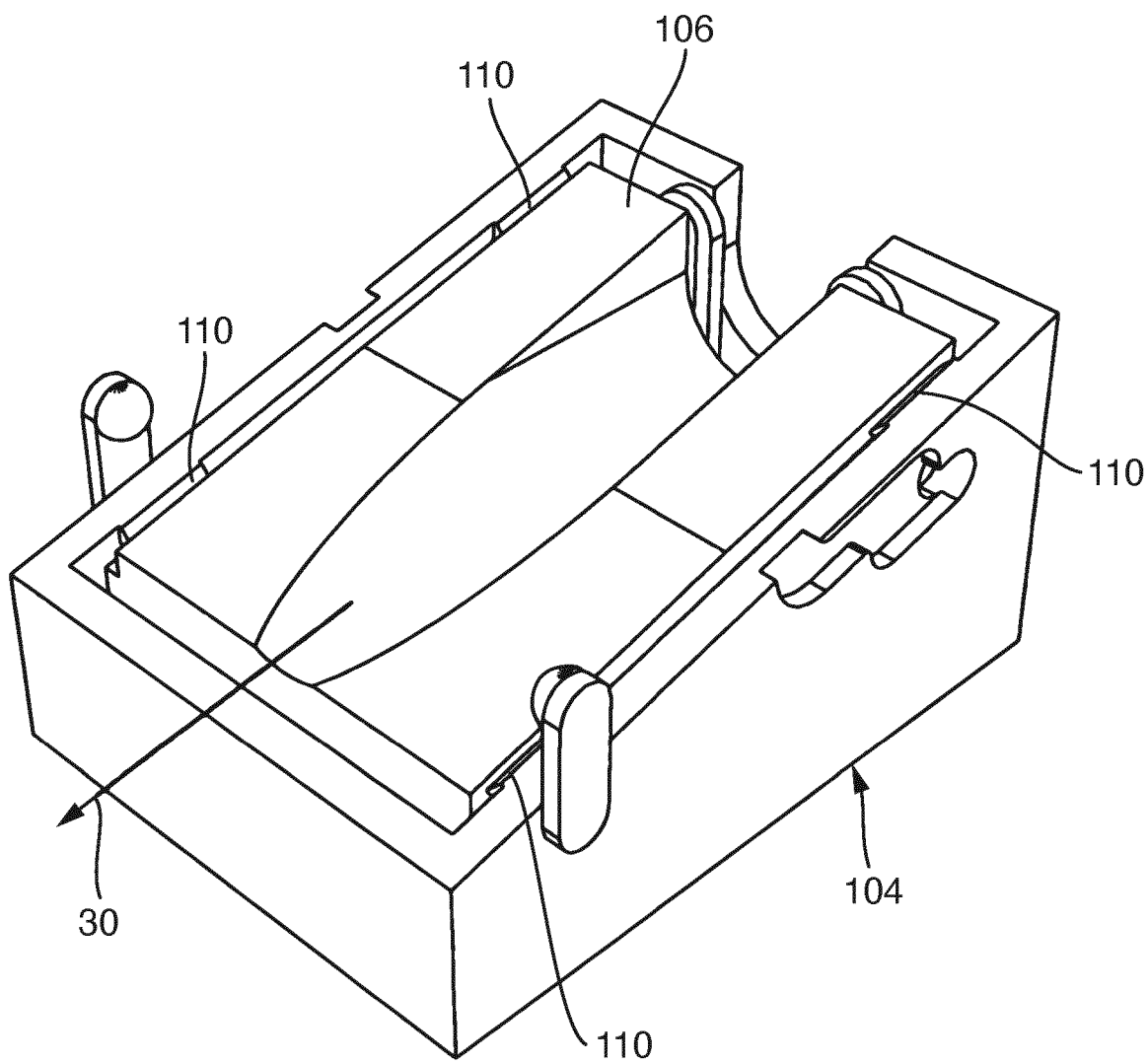

The different arrangement of the latching strips 110—see FIG. 14—is adapted to the different shape of the ferrite elements 106, see FIG. 13. The ferrite elements 106 have contact faces arranged obliquely to the passage direction 30. In this way, the depth of the channel-like recesses of the ferrite elements 106, in which one or more lines may be inserted, reduces towards one side of the ferrite element 106. If two ferrite elements 106 are laid one on the other, again an approximately cylindrical passage for at least one line is formed, which is closed in the radial direction. The ferrite element 106—see FIG. 14—is provided at its top side edge with a respective shoulder which runs also obliquely to the passage direction 30. The latching strips 110 engage on said shoulder in order to prevent the ferrite element 106 from being able to move upward out of the second housing part 104 in FIG. 14. The ferrite element 106 is pretensioned against the latching strips 110 by means of the leaf spring 88 on the floor of the second housing part 104, see FIG. 15.

Figure 16:
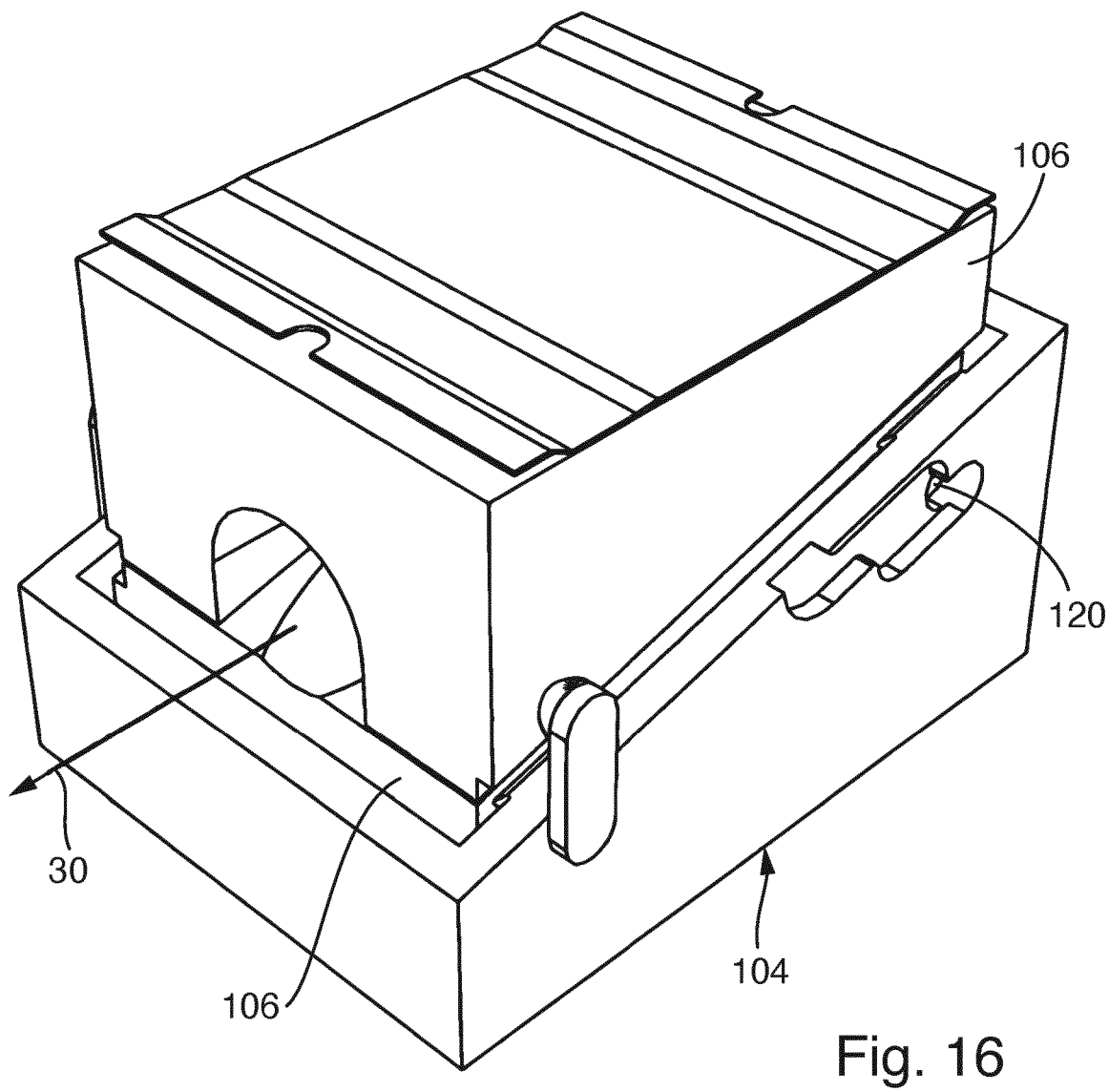

FIG. 16 shows the second housing part 104, wherein both ferrite elements 106 are depicted. In this illustration, it is clear that the two ferrite elements 106 form a substantially cylindrical passage for at least one line. On relative movement of the two housing parts 102, 104 from the open state to the closed state of the housing, not only the top sides of the housing parts 102, 104 but also the contact faces of the ferrite elements 106 form a stop face which defines the end of the relative movement and the closed state of the housing.

Figure 17:
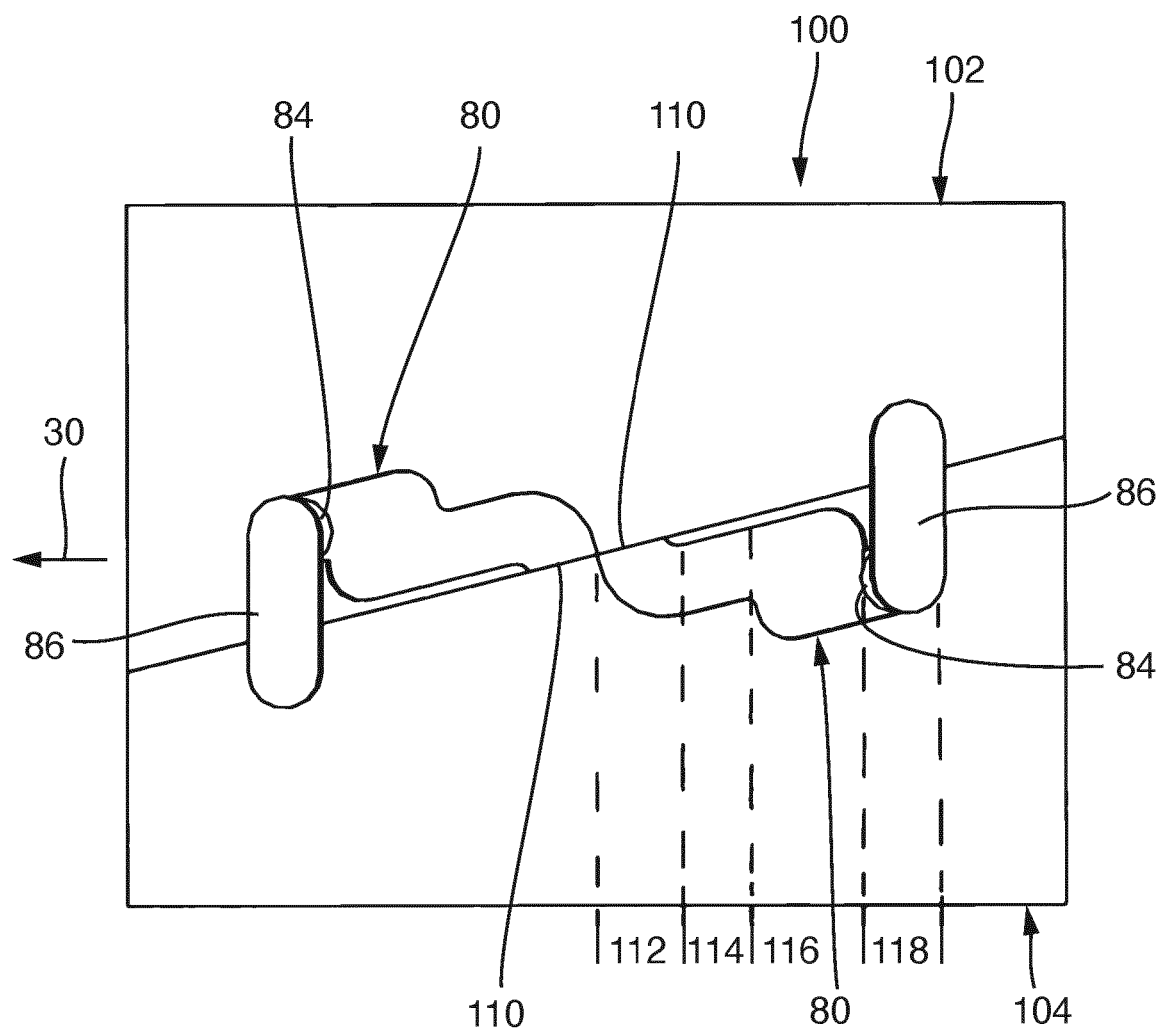

The illustration in FIG. 17 shows the device 100 from FIG. 13 in a side view. The form and function of the sliding block guides 80 of the devices 70 and 100 will be explained with reference to FIG. 17.

Each of the sliding block guides 80 has an insertion opening 110 which simultaneously defines the start of the sliding block guide 80. When the two housing parts 72, 74, 102, 104 are pushed together, a sliding block 84 of the respective other housing part is introduced into said insertion opening 110. The sliding block 84, which is connected by the arm 86 to the upper housing part 102 in FIG. 17, is accordingly inserted from above into the insertion opening 110 of the sliding block guide 80 in the side of the housing part 104 at the bottom in FIG. 17. At the same time, the sliding block 84, which is connected by the arm 86 to the side of the second housing part 104 that is at the bottom in FIG. 17, is inserted from below into the insertion opening 110 of the sliding block guide 80 of the housing part 102 that is at the top in FIG. 17.

Adjacent to the insertion opening 110, each of the sliding block guides 80 then has an arcuate portion 112. The arcuate portion 112 transforms into a rectilinear portion 114 running parallel to the top side of the respective housing part 102, 104. In the portions 112, 114, a height of the sliding block guide 80 is approximately equal to a height of the sliding block 84. The sliding block is thus guided in the sliding block guide 80 approximately play-free or with only slight play in the portions 112, 114.

In a further portion 116 adjoining the portion 114, the sliding block guide 80 again runs parallel to the top side of the respective housing part 104 but increases in height. As a result, the sliding block 84 of the respective other housing part can move in the height direction inside the sliding block guide 80 in the portion 116. This may be necessary for placing the ferrite elements 76, 106 against each other and in some cases for pushing them in the direction towards the respective assigned housing part against the effect of the spring device.

An end portion 118 of the sliding block guide 80 follows the portion 116. In this end portion 118, the height of the sliding block guide 80 is again significantly reduced in comparison with the portion 116 and substantially corresponds to the height of the sliding block 84. Because of the end portion 118 or the transition from the portion 116 to the end portion 118, the sliding block 84 is precisely positioned in the height direction and guided into the region in front of a recess 120 in the side wall of the lower housing part 74, 104. This recess 120 is configured as a latching recess corresponding to the shape of the sliding block 84. As soon as the sliding block 84 enters the end portion 118, it can snap into the recess 120 and thereby securely hold the two housing parts 72, 74, 102, 104 in the closed state of the housing, as shown in FIG. 17.

FIG. 16 shows the recess 120 as a passage opening in the side wall of the second housing part 104. In the context of the invention, the recess 120 may also be formed merely as a depression in the sliding block guide 80. In the context of the invention, it is also possible to provide a protrusion instead of the recess 120, which then snaps for example into a corresponding recess in the sliding block 84.

By means of the sliding block guide 80 and sliding blocks 84, the two housing parts 72, 74, 102, 104 can be guided on each other during a relative movement with respect to each other, the main component of which runs parallel to the passage direction 30, and be reliably brought into an end position. In the end position, the sliding blocks 84 engage in the recesses 120 and thereby simultaneously lock the two housing parts 72, 74, 102, 104 together in the closed state of the housing.

In the context of the invention, separate latching means may be provided which lock the two housing parts together in the closed state of the housing at the end of the relative movement. In the embodiments of the devices 70, 100 depicted, the sliding blocks 84 and the sliding block guides 80 simultaneously perform the function of the locking device. This is not however mandatory in the context of the invention.

Figure 18:
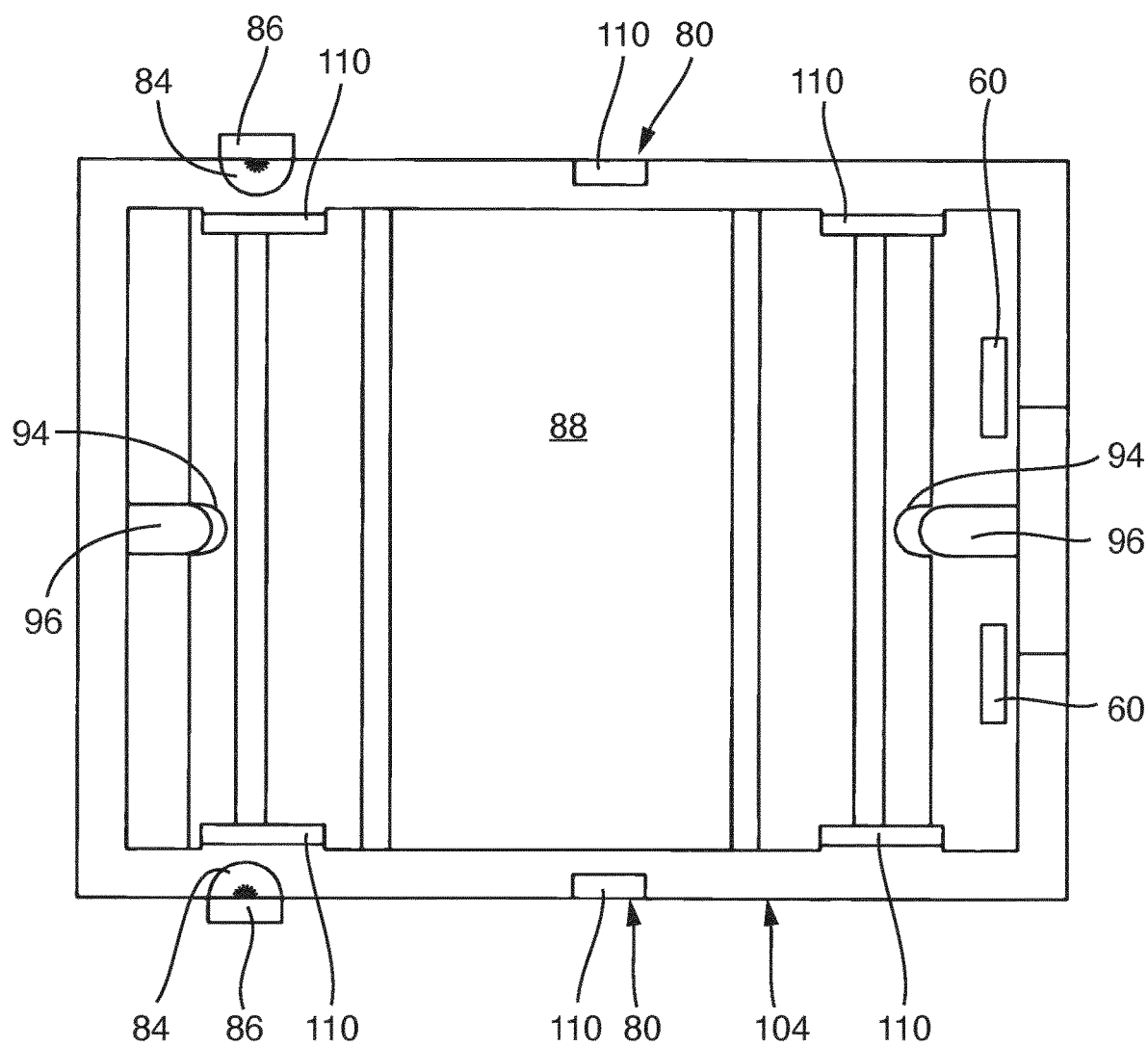

The depiction of FIG. 18 shows the second housing part 104 of the device 100 in FIG. 13 in a view from above. This view clearly shows the leaf spring 88 in a relaxed state, wherein the mutually opposite recesses 94 of said leaf spring engage in portions on the protrusions 96 on the floor of the second housing part 104. This view also clearly shows the U-shaped brackets 60 for clamping the line, and the latching strips 110 for holding the ferrite element 106 against the preload of the leaf spring 88.

The arms 86 and the sliding blocks 84 arranged at the ends of the arms are also visible. The sliding blocks 84 on the housing part 104 are arranged opposite each other. The figure also shows the insertion openings 110 of the two sliding block guides 80 in the opposing side walls of the second housing part 104.

Figure 19:
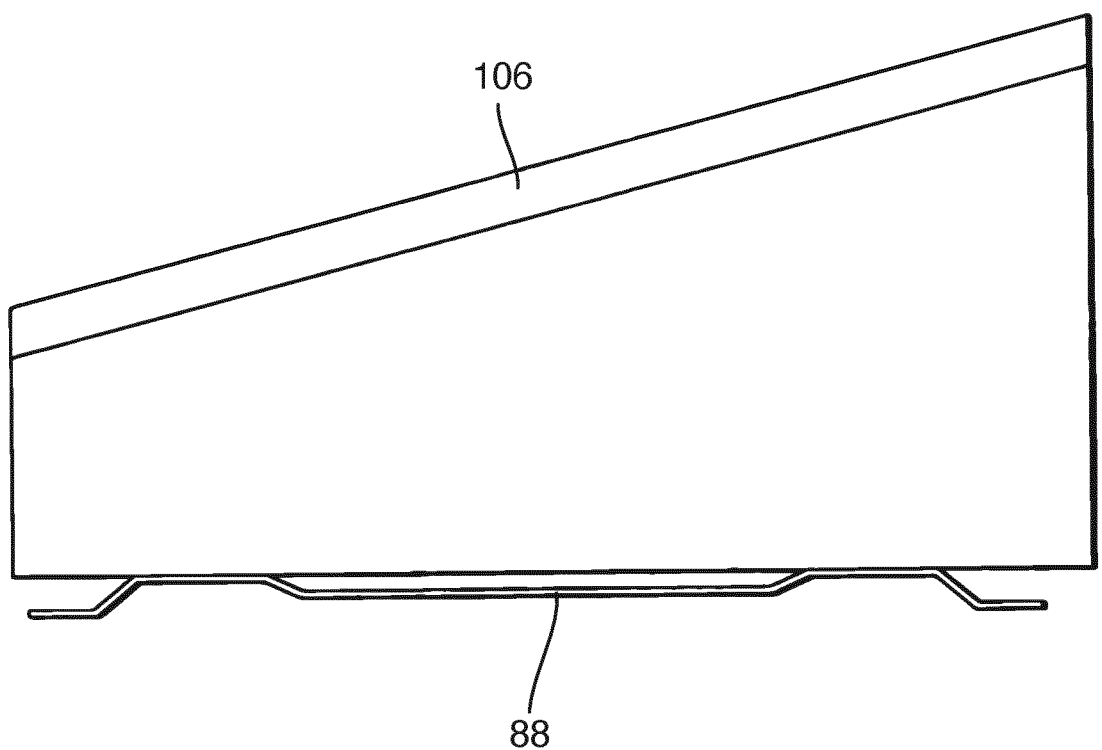

The depiction in FIG. 19 shows the ferrite element 106—see for example FIG. 14—with the leaf spring 88 arranged below the ferrite element. FIG. 18 shows the leaf spring 88 in relaxed state.

Figure 20:
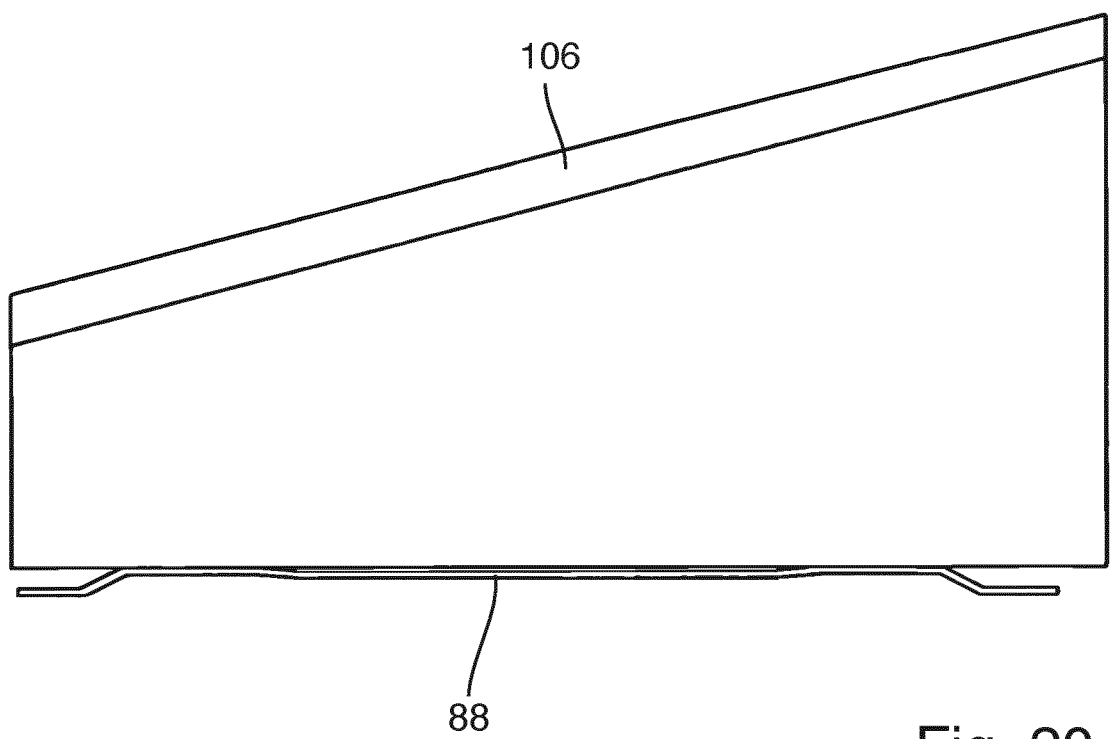

FIG. 20 shows the ferrite element 106 and the leaf spring 88 from FIG. 19 in the state in which the ferrite element 106 is pressed against the leaf spring 88. The leaf spring 88 is thereby in compressed state. This state of the leaf spring 88 is achieved when the housing is in the closed state. The leaf spring 88 then ensures a pretension of the ferrite element 106 in the direction of the opposite ferrite element 106 in the opposite housing part. The ferrite element 106 in the opposite housing part is also pretensioned with an identical leaf spring 88. This ensures that no gap, or only a microscopically small gap, is present between the two ferrite elements 106. In this way, very good electrical and magnetic properties of the ferrite elements 106 may be achieved, and electrical noise on lines can be largely absorbed with the device according to the invention.

The explanations given with reference to FIGS. 19 and 20 also apply to the ferrite elements 46, 76, the top sides of which run parallel to the underside. Here too, the leaf springs 88 or other suitable spring devices ensure a preload of the ferrite elements against each other and a gap-free arrangement of the ferrite elements in the closed state of the housing.

The invention claimed is:

1. A device for absorbing electrical noise on lines, comprising:
   a housing having two housing parts,
      wherein each housing part is provided for receiving an element of a noise-absorbing material,
      wherein in the closed state, the housing has a passage opening in each of two opposing end walls for one or more lines,
      wherein the elements in the housing parts in the closed state of the housing form a passage for one or more lines,
      wherein the passage openings in the housing and the passage formed by means of the elements define a passage direction for the at least one line,
      wherein a locking device is provided for locking the housing parts in the closed state of the housing,
      wherein the housing parts are configured such that by means of a relative movement of the housing parts with respect to each other,
      wherein a main component of the relative movement runs parallel to the passage direction, the housing parts can be moved into the closed state of the housing and locked together in the closed state, and
      wherein the housing is divided obliquely to the passage direction by means of the housing parts.

2. A device according to claim 1, wherein the two housing parts are formed identically.

3. A device according to claim 1, wherein in the closed state of the housing, the elements are divided obliquely to the passage orientation.

4. Device A device according to claim 1, wherein the housing parts are provided with a sliding guide.

5. A device according to claim 4, wherein the sliding guide is formed as a sliding block guide.

6. A device according to claim 4, wherein the sliding guide is configured as a linear guide by means of guide strips.

7. A device according to at least one of the preceding claim 1, wherein the locking device comprises latching means with latching protrusions and latching recesses.

8. A device according to claim 7, wherein the latching means are arranged separately from the sliding guide.

9. A device according to claim 7, wherein the latching means have sprung latching arms.

10. A device according to claim 7, wherein the latching means are arranged on the sliding guide.

11. A device according to claim 10, wherein the latching means have at least one latching recess in the sliding guide.

12. A device according to claim 1, wherein at least one of the elements is provided with at least one approach chamfer, wherein the approach chamfer runs on the respective other element during the relative movement from the open state to the closed state of the housing.

13. A device according to claim 1, wherein a spring device is provided between a respective element and the assigned housing part in order to pretension the element in the direction of the element in the other housing part when the housing is closed.

14. A device according to claim 13, wherein the spring device comprises a leaf spring.

15. A method for arranging a device according to claim 1 on at least one electrical line, comprising:
   moving of the two housing parts of the housing of the device into the closed state of the housing by means of a relative movement of the two housing parts with respect to each other.

* * * * *